April 7, 1964 J. M. GAULT ETAL 3,128,213

METHOD OF MAKING A SEMICONDUCTOR DEVICE

Filed July 20, 1961

INVENTORS
JOHN M. GAULT
JOHN R. MOROSS
BY
OSTROLENK, FABER, GERB & SOFFEN
ATTORNEYS

United States Patent Office 3,128,213

Patented Apr. 7, 1964

3,128,213
METHOD OF MAKING A SEMICONDUCTOR DEVICE

John M. Gault, Manhattan Beach, and John R. Moross, Whittier, Calif., assignors to International Rectifier Corporation, El Segundo, Calif., a corporation of California Filed July 20, 1961, Ser. No. 125,556
4 Claims. (Cl. 156—17)

This invention relates to a method of manufacture of a semiconductor device having a junction therein and more specifically relates to the manufacture of semiconductor wafers, wherein the wafers are only partially cut from their ingot and the various operations in forming the junction are performed while the individual wafers are still an integral part of the ingot.

In manufacturing semiconductor wafers having one or more junctions therein, it is common practice to first slice thin wafers from an ingot and to thereafter operate on each individual wafer to form the junction. These individual wafers are quite thin and fragile so that considerable breakage occurs during the manufacturing process. Moreover, since a great number of individual wafers must be carefully handled, considerable manufacturing time is expended. Furthermore, when the wafers are handled one at a time considerable amounts of material are consumed before the final wafers having junctions therein are formed.

The essence of the present invention is to provide a novel method of manufacture of a plurality of semiconductor wafers having junctions formed therein while the wafers are only partially cut from their ingot. Thus, the complete ingot which could, for example have 150 partially cut wafers therein is the single element to be handled in forming a junction in the 150 wafers. The ingot which is presliced to cross section of a comb, will, as a unitary body, go through a first etching operation for preparing the exposed surfaces of the individual wafers secured to the ingot, and a doping operation for rendering the exposed surfaces of the material of an appropriate conductivity type. Thereafter, alternate spaces of the comb can be masked and one of the N type surfaces of each of the individual wafers can be removed as by a hydrofluoric acid rinse. The surfaces retaining the N doping are then masked and the rinsed surfaces receive a P type doping operation whereby the junction is formed. The unit may be thereafter dipped into an etching compound to prepare it for plating and the surfaces plated as with a nickel plate for receiving electrodes. Thereafter, each of the individual wafers are separated from the single unitary body and can be diced or otherwise prepared for assembly into an appropriate electric device.

Accordingly, a primary object of this invention is to provide a novel method of manufacture for semiconductor devices.

Another object of this invention is to provide a simplified method of manufacture for wafers of semiconductor materials which are to have junctions formed therein.

Another object of this invention is to reduce handling time during manufacture of semiconductor wafers.

A still further object of this invention is to provide a method of manufacture for semiconductor wafers which has a high percentage yield.

A still further object of this invention is to provide a simplified method of manufacture for semiconductor wafers having a junction therein whereby the wafers are partially cut in the ingot and the complete ingot is handled as a unitary body for all of the junction forming steps to be applied to the individual wafers.

These and other objects of this invention will become apparent from the following description when taken in connection with the drawings in which.

Figure 1:
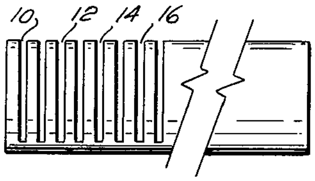
FIGURE 1 shows an ingot of semiconductor material with the wafers partially cut therein.
Figure 2:
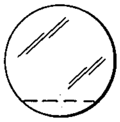
FIGURE 2 is an end view of FIGURE 1.

Referring first to FIGURES 1 and 2, We have shown an ingot of semiconductor material such as germanium or silicon which has been grown as a single crystal by normal crystal growing techniques. In order to fabricate wafers having at least one PN junction therein, it is customary to slice the ingot of FIGURE 1 into a plurality of individual wafers and thereafter operate on each of the individual wafers.

By way of example, the ingot of FIGURE 1 could be one inch in diameter and six inches long. The ingot is then sliced into a large number of individual wafers. In this prior technique, it is of course necessary to individually handle each of the wafers. Because these wafers are fragile, there is considerable breakage even when the most experienced personnel perform the manufacturing operation. Moreover, there is a substantial amount of loss of material during the forming operations where the single crystal material is extremely expensive and is, for example, of the order of $5.00 per gram. Further, since the individual wafers must be individually handled, it is apparent that the manufacturing operation is extremely time consuming.

In accordance with the present invention and rather than completely slicing the wafers from the ingot of FIGURE 1 the wafers are only partially sliced as illustrated and remain unitary with the ingot at a lateral portion of the crystal. Thereafter, all of the junction forming operations may be performed on each of the individual wafers partially formed in the ingot.

In one typical manufacturing operation the ingot of FIGURES 1 and 2 is first grown in a usual manner and the plurality of cuts shown are made in the ingot by a diamond saw used in the normal manner. The thickness of the individual teeth or wafers may range from 8.5 mils to 10 mils and are spaced by the thickness of the saw cut which is of the order of 15 mils. After cutting the individual partial wafers, the complete assembly is dipped into an etching medium such as sodium hydroxide which will prepare the exposed surfaces for the next operation. This is the equivalent of the lapping operation which would initially be applied to wafers which are completely cut from a single ingot.

After the etching operation, the complete pre-cut ingot is immersed in an N type doping medium so that all of the exposed surfaces are rendered N type. For this purpose the complete ingot could be immersed in a phosphorous containing atmosphere or fluid such as phosphorous pentoxide and retained therein at a temperature of 1150° C. for approximately ½ hour.

Thereafter, the ingot is removed from the N type doping atmosphere and the alternate spaces such as spaces 10, 12, 14 and 16 (there may be as many as 150 teeth and only a few are shown for the purpose of illustration) are masked for example by an acid resistant masking material such as Apiezon wax. The complete ingot is then exposed to a hydrofluoric acid rinse which will remove the phospho-silicate glass from the "N" doped surface regions which are not masked. This is to be contrasted to the previously used lapping operation for wafers which are individually handled.

The masking material is then removed and the complete ingot is immersed in a boron doping medium such as a boron trichloride atmosphere so that a P type doped layer is applied to all exposed surfaces of the ingot. It may be desirable to mask the previously formed N type surface during the P doping operation. The ingot immersed in its boron atmosphere is then placed in a furnace and the temperature is elevated so that the boron will diffuse into the material of the wafers. For example, when using a boron trichloride the temperature is raised to approximately 1270° C. for 16 hours in a furnace which contains some inert gas such as nitrogen to exclude impurity materials.

The complete ingot is thereafter prepared for plating as by placing the ingot in an etching compound such as NaOH solution. This will be contrasted to the previously used sandblast operation which prepares the individual wafers for the plating operation.

The complete ingot, where each of the wafers connected thereto now have junctions formed therein, is then placed in a nickel plating bath where nickel is plated on the exposed surface of the ingot. This is followed by a sintering operation and a subsequent nickel plating operation.

At the end of this operation each of the individual wafers comprise a wafer having a junction therein with nickel plating on the opposing surfaces for ultimately receiving electrodes. It is only at this stage that the individual teeth or wafers are separated from the common body as by a further slicing operation with a diamond saw.

The individual wafers may thereafter be diced by mechanical dicing or any other desired method to form individual junction elements of appropriate cross-sectional area. It will be noted that where the complete wafer area is to be used, as in a high current carrying application, that it is necessary to remove the outer rim of the element including the area at which it was formerly joined to the ingot. Electrodes may then be connected to the nickel plated surfaces of each of the individual diced wafers to then form a complete unit.

It has been found desirable that subsequent to the N type doping operation of the ingot in FIGURE 1, the ingot be covered with an acid resistant tape so that all of the edges of the slices are well bonded over their entire circumference to the tape. The tape is then cut over every other slot so that hydrofluoric acid can fill the volume of every other slot to dissolve the glass from only one flat surface of each wafer whereby the masking operation using an Apiezon wax may be omitted. After this etching step the acid may be drained and the ingot washed and dried prior to dipping in the P type solution.

Figure 3:
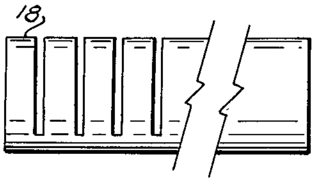
FIGURE 3 is a side view of an ingot of semiconductor material pre-cut in accordance with a second embodiment of the invention.
Figure 4:
FIGURE 4 is an end view of the ingot of FIGURE 3.
Figure 5:
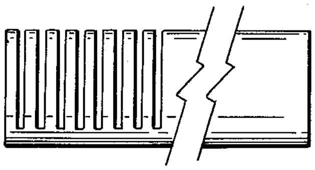
FIGURE 5 shows a side view of the ingot of FIGURE 3 after a second slicing operation.

As a second embodiment of the invention as illustrated in FIGURES 3 and 4, the ingot may initially be sliced at every other wafer position. That is to say a single wafer thickness will contain two of the wafers to be formed in the final manufacturing operation. Thus in FIGURE 3, wafer 18 will be later sliced to form two individual wafers in a further operation shown in FIGURE 5. The wafers, such as wafer 18 will have the thickness of the order of 50 mils while the spacing between the teeth will again be of the order of 15 mils.

In the embodiment of the invention set forth in FIGURE 3, and after the initial slicing operation, the surfaces are etched and the unit is immersed in an N doping medium as previously described. After the N doping operation, the ingot is remounted in the diamond saw device and the second slot is cut in the center of each of the teeth so that the resulting ingot has the form shown in FIGURE 5 (which is identical to FIGURE 1). Thereafter, the alternate spaces between the wafers whose opposing surfaces are N type, are masked as described above to protect the N doped layer and the ingot is placed in an etching medium which etches away the surface areas of the slice exposed to the diamond saw. The unit is then ready for the P doping operation and the remaining steps as described above for FIGURES 1 and 2.

The advantage of the method described in FIGURES 3 and 4 over the method of FIGURE 1 is there is a less critical masking requirement subsequent to the first etching operation and the N doping operation. This however, is somewhat offset since the ingot must be remounted with special attention taken to see that the next slices fall immediately at the center of each of the wafers.

In the foregoing, we have described our invention only in connection with preferred embodiments thereof. Many variations and modifications of the principles of our invention within the scope of the description herein are obvious. Accordingly, we prefer to be bound not by the specific disclosure herein, but only by the appending claims.

We claim:

1. A method of making a plurality of semiconductor devices comprising the steps of partially cutting through an ingot of semiconductor material to form a plurality of partially formed wafers secured to one another over uncut portions of said ingot, producing P-N conductivity junctions on each of said partially formed wafers by sequential treatment with controlled impurities of the appropriate conductivity types, heating the surfaces of said partially formed wafers to produce the corresponding conductivity type zones, and then completely cutting said wafers from said ingot.

2. A method of making semiconductor wafers comprising the steps of:

(*a*) cutting a plurality of spaced slices partially through an ingot of semiconductor material so that a plurality of wafers are partially formed secured to one another over the uncut portion of the ingot,
(*b*) treating the exposed surfaces of said ingot to convert said exposed surfaces to a first conductivity type,
(*c*) masking a plurality of said exposed surfaces,
(*d*) etching the residual exposed surfaces of the ingot,
(*e*) removing said masking and treating the exposed surfaces of said ingot to convert said surfaces to the opposite conductivity type and thereby form at least one P–N junction in each of said wafers, and
(*f*) thereafter separating the individual wafers from said ingot.

3. A method for simultaneously manufacturing a plurality of semiconductor wafers comprising the steps of (*a*) cutting a plurality of spaced slices partially through an ingot of semiconductor material so that a plurality of wafers are partially formed secured to one another over the uncut portion of the ingot,
(*b*) etching the exposed surfaces of said ingot,
(*c*) applying a controlled impurity to said exposed surfaces of said ingot to convert said surfaces to a first conductivity type,
(*d*) covering the exposed surfaces of said ingot with an etchant resistant tape and cutting said tape over various of said spaced slices to thereby mask the remaining spaced slices aligned with the uncut tape,
(*e*) etching the surfaces of said ingot exposed through the cuts made in said etchant resistant tape,
(*f*) removing said tape and treating the exposed surfaces of said ingot to convert said surfaces to the opposite conductivity type thereby forming at least one P–N junction in each of said wafers, and
(*g*) thereafter separating individual semiconductor wafers from said ingot.

4. A method of making semiconductor wafers comprising the steps of:

(*a*) cutting a plurality of spaced slices partially through an ingot of semiconductor material to define a plurality of partially formed wafers secured to one another over the uncut portion of the ingot,
(*b*) treating the exposed surfaces of said ingot to convert said exposed surfaces to one of the conductivity types, (c) partially slicing each of said partially formed wafers into a pair of individual wafers secured to each other along uncut portions of said ingot, (d) masking the previously exposed surfaces of said ingot of said one conductivity type, (e) etching the remaining exposed surfaces of said ingot, (f) removing said masking and treating the exposed surfaces of said ingot to convert said surfaces to the other of said conductivity types and thereby form at least one conductivity junction in each of said individual wafers, and (g) thereafter separating the individual wafers from said ingot.

References Cited in the file of this patent

UNITED STATES PATENTS

| | | |
|---|---|---|
| 2,762,954 | Leifer | Sept. 11, 1956 |
| 2,865,082 | Gates | Dec. 23, 1958 |
| 2,899,344 | Attalla et al. | Aug. 11, 1959 |
| 3,022,568 | Nelson et al. | Feb. 27, 1962 |